United States Patent [19]

Knecht et al.

[11] Patent Number: 5,235,135
[45] Date of Patent: Aug. 10, 1993

[54] SEALED ELECTRONIC PACKAGE PROVIDING IN-SITU METALLIZATION

[75] Inventors: Thomas A. Knecht, Crystal Lake; Brian M. Mancini, Carol Stream; Joseph P. Krause, Wheaton, all of Ill.

[73] Assignee: Motorola, Inc., Schaumburg, Ill.

[21] Appl. No.: 836,643

[22] Filed: Feb. 14, 1992

[51] Int. Cl.$^5$ .................. H05K 5/06; H01L 41/04
[52] U.S. Cl. .................. 174/52.3; 310/312; 204/298.11
[58] Field of Search .................. 174/52.1, 52.3; 310/312; 204/298.02, 298.11, 192.15, 192.17

[56] References Cited

U.S. PATENT DOCUMENTS

| | | | |
|---|---|---|---|
| 2,808,523 | 10/1957 | Holmbeck | 310/312 |
| 3,006,711 | 10/1961 | Silver | 310/312 |
| 3,028,262 | 4/1962 | Klingsporn | 310/312 |
| 4,391,034 | 7/1983 | Stuby | 204/298.11 |
| 4,410,407 | 10/1993 | Macaulay | 204/298.11 |
| 4,849,079 | 7/1989 | Cuomo et al. | 204/192.17 |

*Primary Examiner*—Harold Broome
*Attorney, Agent, or Firm*—Joseph P. Krause

[57] ABSTRACT

In-situ adjustments to frequency characteristics of an electronic device such as a piezoelectric element (40) can be accomplished by means of a predetermined atmosphere (18) enclosed within a package comprised of a base (12) and a cover (14) and an included amount of sputterable electrode material (22). By attachment of appropriate electric potentials (2), electrode molecules can be sputtered onto the electrode surfaces adjusting the resonant frequency characteristics of a crystal filter.

29 Claims, 3 Drawing Sheets

SEALED ELECTRONIC PACKAGE PROVIDING IN-SITU METALLIZATION

FIELD OF THE INVENTION

This invention relates to electronic component packaging. More particularly, this invention relates to packaging for devices such as piezoelectric devices that are hermetically sealed after their manufacture and which might benefit by tuning, adjustment, or reconfiguration after enclosure but also which are inaccessible in the enclosure.

BACKGROUND OF THE INVENTION

Piezoelectric devices are well known in the art and include crystal oscillators and surface acoustic wave resonators. A piezoelectric device may be considered any material that demonstrates piezoelectric behavior.

Most of these devices comprise a thin slab of quartz upon which are deposited thin metallic electrodes. The electrical characteristics of these devices depend upon many factors including the quartz's temperature, the orientation of how the quartz slab is cut, the physical dimensions of the slab, as well as the number and dimensions of electrodes deposited on the surface of the quartz.

In virtually all piezoelectric devices, once the dimension and the geometry of the quartz slab are selected, the sole remaining variable that affects a piezoelectric devices performance are the number and dimensions of the electrodes. For example, it is well known that a quartz resonator, comprising a particular slab of quartz and at least two electrodes on opposing faces of the quartz, will have its resonant frequency determined, in part, by the size and thickness of the electrodes deposited on it. Moreover, for an electrode of any given area, the resonant frequency of a quartz resonator can be lowered by increasing the thickness, (i.e. mass loading) of the electrode while the resonant frequency can be increased by decreasing the thickness or mass of the electrode. A monolithic quartz filter which generally comprises two or more individual resonator stages on a single piece of quartz, has its characteristics, including pass-band frequency and bandwidth and input-output coupling, determined in large part not only by the geometry of the crystal cut but the thickness and surface area of the electrodes as well.

In the manufacture of piezoelectric devices, after the quartz geometry is selected, the electrodes are deposited onto the surface of the quartz using well known techniques such as sputtering, vapor deposition, and so forth. Final tuning of a quartz or piezoelectric device typically involves either selective removal of electrode material (which is exceedingly tedious) or it may include an addition to conductive electrode material in a controlled environment to bring the device to a desired set of specifications.

A major source of defects in the manufacture of packaged piezoelectric devices, (i.e. metallized quartz slabs) mounted in a sealed or hermetically sealed container, is the frequency shift experienced when an otherwise tuned piezoelectric element is mounted in a hermetically sealed package. Even during the manufacture of electronic circuit boards using so-called surface mount piezoelectric packages, the metallized quartz crystals are positioned in a package or case which is evacuated, sealed with an appropriate material, heated at some temperature during the sealing process and during the assembly process of a circuit board and then cooled. During the final manufacturing of the crystal package itself wherein the metallized quartz is mounted in a package, as well as final assembly of an electronic circuit board, the desired operating frequency characteristics of piezoelectric devices invariably changes, even if only slightly, from that which was obtained during the final tuning of the piezoelectric but element before its insertion into the package, and in many instances rendering an unusable, defective part.

Prior art solutions for this frequency shift experienced during the manufacture of packaged piezoelectric devices, has been a compensation for an expected frequency shift encountered during the packaging of the devices. For example, if a quartz resonator is desired to have a resonant frequency of 45.00 MHz but it is known that through the packaging process of the quartz slab its resonant frequency decreases by 2000 Hz, the resonant frequency at the finish plate operation in the quartz final tuning process can be adjusted to be 45 MHz plus the 2000 Hz lost during the packaging process. This prior art technique, however, relies upon an otherwise imperfect manufacturing process to continuously insert the same defect, i.e. the same frequency shift, to the finished pieces.

An improved package for electronic components, such as piezoelectric devices that require precise addition or subtraction of material to their surfaces to accomplish or to effect their final operating characteristics, and one that avoids having to rely upon added defect consistency, would be an improvement over the prior art. Such a package might even allow for frequency adjustments to be made even if the device is installed in a circuit board.

SUMMARY OF THE INVENTION

There is provided a sealed electronic device package, which package encloses a volume within it where an electronic device is located, and which package enables adjustment of the enclosed device after it is sealed in the enclosed volume. The device comprises a base and a cover which enclose a volume in which the electronic device is located. A predetermined atmosphere is provided within the volume prior to its closure that permits sputterable electrode material to be sputtered on to the surfaces of the enclosed device when appropriate electric potentials are applied to the sputterable electrode material and surfaces on the electronic device to which the electrode material is to be sputtered.

In the preferred embodiment, this sealed package permits a piezoelectric device, for example, to be finally tuned to its resonant frequency after its final assembly. Small amounts of electrode material can be deposited on to the electrodes on the surface of a piezoelectric plate to increase its mass loading decreasing its resonant frequency. It might also be possible to de-sputter material from the surfaces of the electrodes, decreasing mass loading as well.

DESCRIPTION OF A PREFERRED EMBODIMENT

Figure 1:
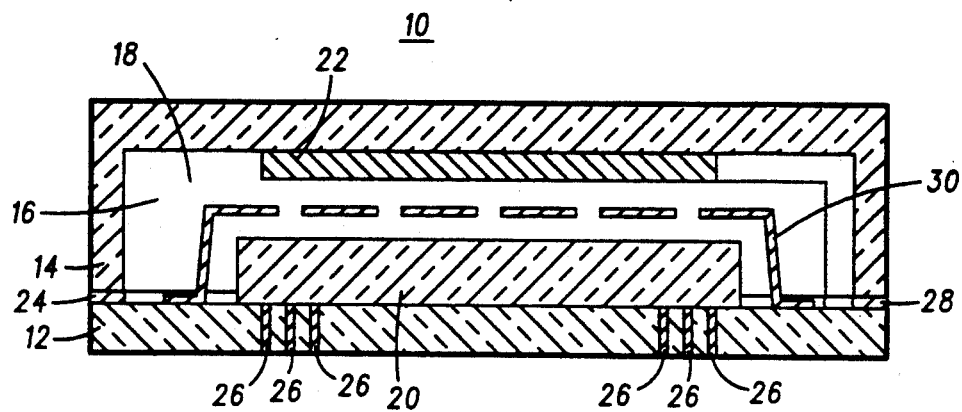
FIG. 1 shows a side view of the electronic device package enclosing a semiconductor device.

FIG. 1 shows a side view of a sealed electronic package (10) that enables adjustment and/or reconfiguration of an electronic device enclosed within the package (10). The enclosed electronic device (20) might include for example an EEPROM or other integrated circuit. The package (10) comprises a base (12) that is at least mechanically coupled to a cover (14) which when the base and cover are coupled together enclose a volume (16).

Prior to enclosure of the volume (16) by the joinder of the base and cover (12 and 14) respectively, the enclosed volume (16) is evacuated to remove undesirable contaminants. After evacuation, the volume (16) is charged with a very small amount of gas that assists in creating a plasma within the volume by which atoms can be sputtered from the surface of the material (22). The predetermined gaseous atmosphere added to the volume is such that when the cover and base are joined together this predetermined gaseous atmosphere is enclosed within the volume (16).

An appropriate electronic device (20), (One that might be reconfigured by selectively sputtering material onto one of its surfaces, such as an integrated circuit or EEPROM for example.) might be electrically reconfigured by the deposition of conductive material on to at least one surface, such as its upper surface as shown in FIG. 1, even after the electronic device (20) is permanently enclosed within the package (10). By selectively applying appropriate electric potentials to the surfaces to be metallized, and by means of a quantity of sputterable electrode material (22) enclosed within the volume (16), electrode material can be deposited onto the device (20). By the application of an appropriate electrical potential to the sputterable electrode material (22) and to conductive surfaces on the electronic device (20), a plasma can be created inside the volume (16) by the presence of the gas added to the volume (16) that can be used to metallize or selectively metallize surfaces of the electronic device (20).

It should be obvious to one skilled in the art that to benefit from this invention, the electronic device (20) should be one that might benefit from the ability to selectively deposit metal atoms onto its surfaces. Some integrated circuits that employ so called fusible links might benefit from the ability to reconnect these links by means of sputtering conductive material back on to the surfaces that were fused in a programming operation.

Figure 2:
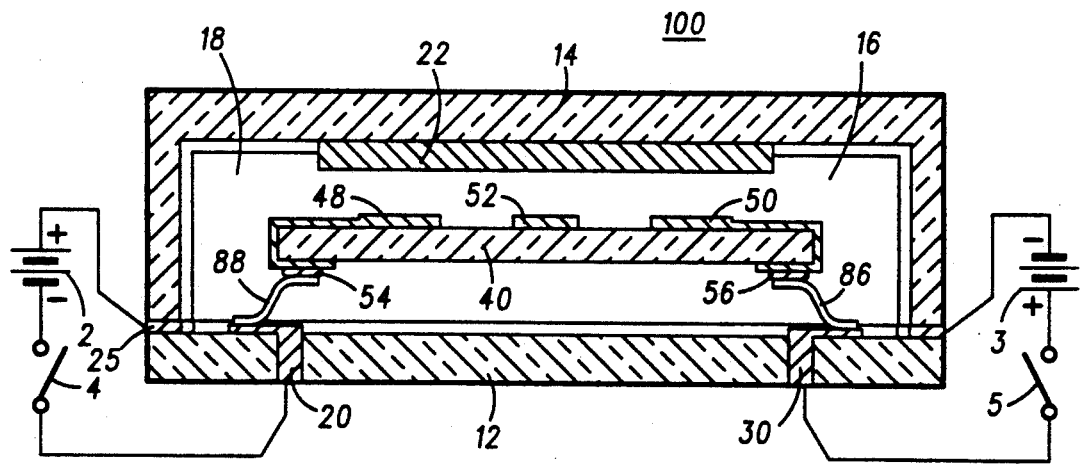
FIG. 2 shows a side view of a hermetically sealed package enclosing a piezoelectric device.

FIG. 2 shows a cross-sectional or side view of a hermetically sealed piezoelectric package (100). FIG. 2 shows a base (12), which is preferably ceramic coupled to a cover (14) which is also preferably ceramic that in the embodiment shown in FIG. 2 are hermetically coupled together sealing the volume (16) by means of a seal layer (25) between the cover (14) and base (12).

Prior to final assembly or coupling of the base (12) to the cover (14), but preferably after its (16) evacuation, the enclosed volume (16) has a predetermined amount of argon gas (18) added to it. The argon gas permits the formation of a plasma within the volume (16) permitting the sputterable electrode material (22) deposited on the cover (14) to be liberated from the surface of the sputterable material. (Gases other than argon might be used as well.) Those skilled in the art will recognize the relevance of Paschen's law in the optimum selection of the pressure of the enclosed gas (18) with the equally important consideration of the distance separating the electrodes (48, 50 and 52) on the surface of the piezoelectric device (40) from the source of the sputterable electrode material (22). Since it is well known in the art that the breakdown voltage required to establish a plasma is dependent upon the distance between the electrodes and the atmospheric pressure within the enclosed volume (16) different sputtering voltage/argon pressure/electrode spacing combinations can be selected for a particular structure and device.

As shown in FIG. 2, an appropriate electric potential can be applied from a dc voltage source (2 or 3 for example) upon the closure of the switch means (4 or 5 for example) which voltage source(s) as shown in FIG. 2 can selectively metallize either electrodes (48 or 50) independently of each other, to increase the mass loading on them and thereby adjust the tuning of the piezoelectric device (40).

(FIG. 2 is intended to show a cross-sectional diagram of a piezoelectric filter having a first resonator comprising either electrode (40 or 50) in combination with a ground layer on the bottom side of the piezoelectric quartz element (40), which bottom layer is not shown for clarity purposes.)

Referring to electrode (48) for example a conductive path to the exterior of the piezoelectric package (100) exists by virtue of the metallization that wraps around the left side of the quartz plate (40) to reach a conductive adhesive dollup (54) that is used to suspend or support the piezoelectric element on the left side by a metallic spring member (88). The lower end of the metallic support (88) is coupled to a feed through (20) to which connection can be made to either a signal source when the package is in an assembled product or to a voltage source (2) that can be used during final tuning of the assembled device.

The upper electrode (50) of a second resonator comprising the filter is connected to the other voltage source (3) by means of the signal path existing through adhesive dollup (56), support member (86), feedthrough (30) and switch (5). Appropriate electric potential can be established between electrode (48) or (50) with respect to the source of sputterable electrode material (22) by appropriate selection of the polarity of the voltage sources.

In addition to a crystal filter, the piezoelectric device depicted in FIG. 2 might just as well be a single crystal resonator comprising only a single upper electrode and a lower ground or reference electrode for example. The piezoelectric device might also be a so called surface acoustic wave device for example. Other embodiments depicted in FIG. 5 for example might include a crystal oscillator comprising of a piece of quartz to which is mounted other active or passive electronic components.

In the preferred embodiment the gas that was enclosed within the volume (16) was an argon gas at a pressure between 1 and 100 microns of mercury. The sputterable electrode material might for example include gold or silver but could also be any conductive material as well. The cover is sealed to the base using appropriate solder that also provides a conductive path between the exterior of the packages and the sputterable electrode material (22).

Figure 3:
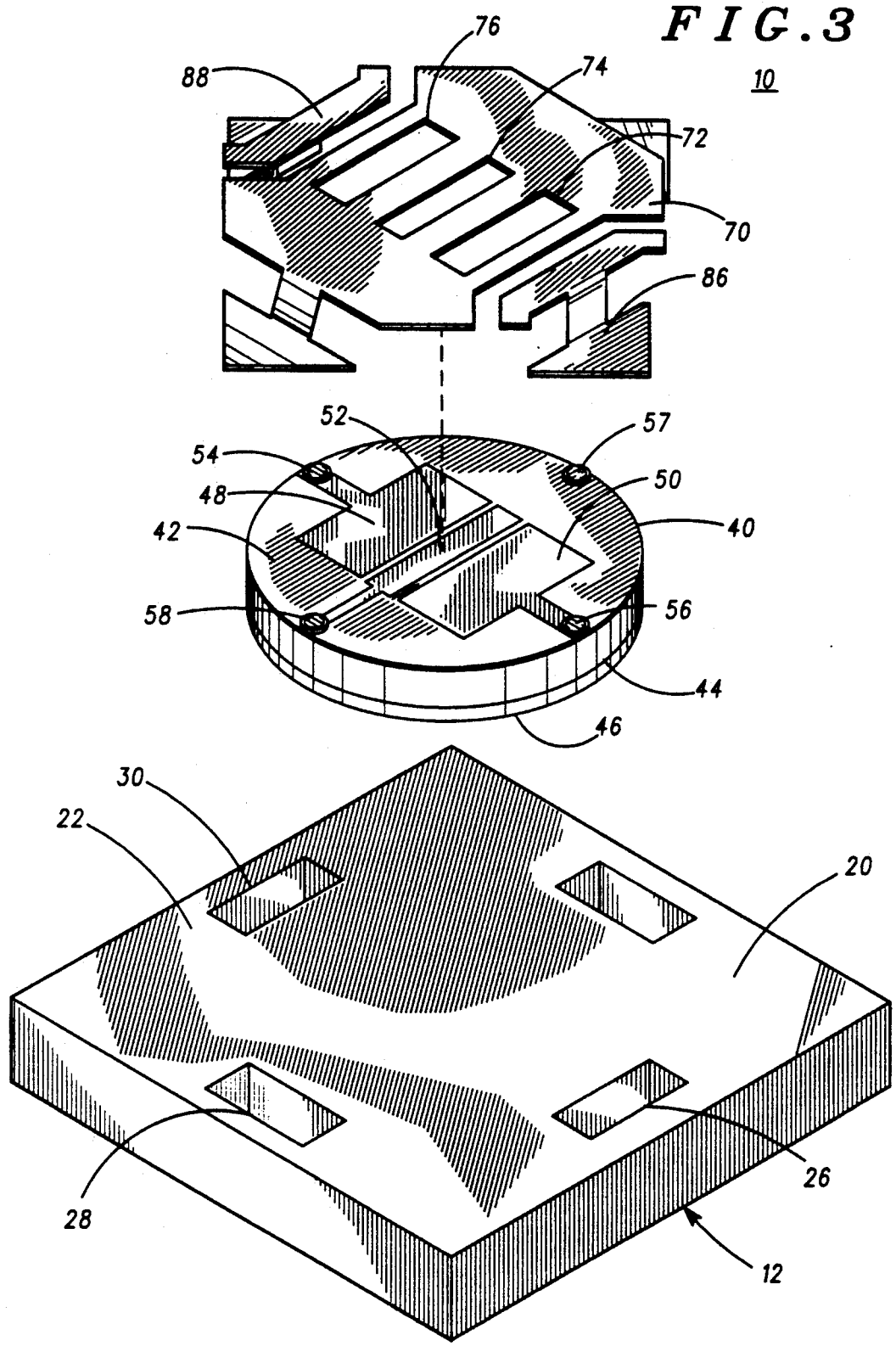
FIG. 3 shows an exploded perspective view of the assembly shown in the enclosures depicted in FIG. 4.

FIG. 3 shows an exploded perspective view of a base (12), a piezoelectric element (40) and its included metallized electrodes, and an aperture mask (70). A substantial improvement in the sputtering metallization can be achieved using the so-called in-situ or aperture mask (70) depicted in FIG. 3. The use of such a mask is disclosed in U.S. patent application Ser. No. 689,397, by Knecht, for a "Surface Mountable Piezoelectric Device With An In-situ Finish Plate Mask" which application is assigned to the assignee of this patent application.

Referring to the aperture mask (70), included with it are three apertures (72, 74, and 76) which when the mask (70) is mounted to the base (12) with the piezoelectric element (40) suspended from it, substantially align with the three metallization areas (50, 52 and 48 respectively) on the upper surface (42) of the piezoelectric element (40). The piezoelectric element (40) is attached to and suspended from the mask (70) by means of conductive adhesive dollups (54, 56, 57, and 58) which contact mating surfaces on the under side of the mask (70) and the connection leads (86 and 88) that are cut away from the mask as described in the above-identified U.S. patent application. Feedthroughs or vias (26, 28 and 30) in the substrate (12) permit electrical contact be made to the metallized areas or electrodes (48, 52, and 50).

Figure 4:
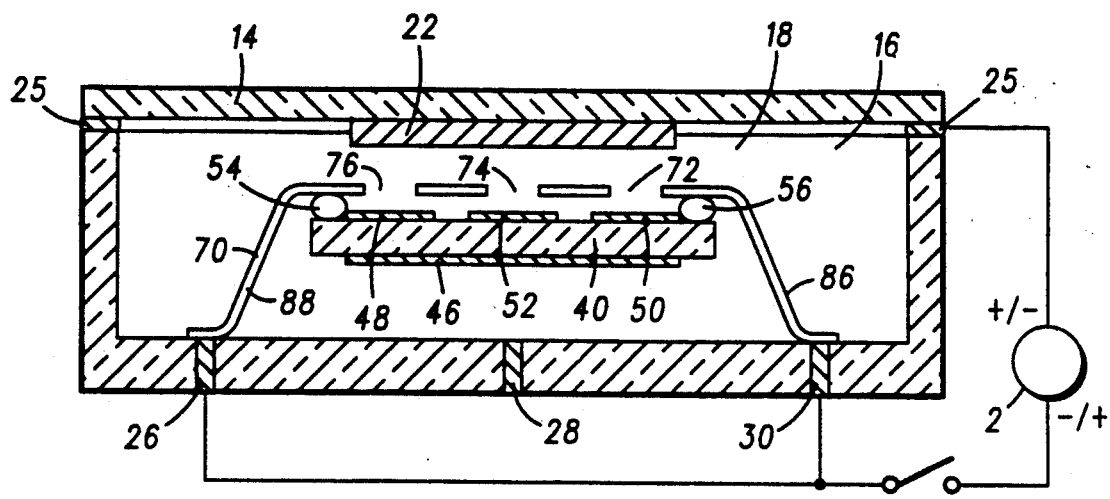
FIG. 4 shows a side view of the preferred embodiment.

Referring to FIG. 4, there is depicted a cross-sectional view of the preferred embodiment of the invention. The structure shown in FIG. 4 permits final tuning of the enclosed piezoelectric device (40) by way of an in-situ metallization process enabled by the inclusion of the sputterable material (22) in the enclosed volume (16) to which is added the predetermined plasma supporting argon gas.

In this figure, the base is a bathtub shaped structure (12) in which a structure similar to that shown in FIG. 3 is deposited. The cover (14) is hermetically sealed by means of a solder seal (25) between the cover (14) and base (12).

The enclosed volume (16) is charged with a predetermined amount of argon gas (18). Electrical connection to the electrodes (48) is by means of the conductive via (26) in the bottom of the base (12) to the portion of the foil (88) depicted in FIG. 3 and the conductive dollup (54) connection to the second resonator element electrode (50) is by means of the conductive via (30) and the second signal lead (86) of the mask (70) also as depicted in FIG. 3.

Openings in the mask (72, 74 and 76) substantially align with the electrodes (50, 52, and 48) such that sputtered molecules from the source of sputterable electrode material (22) that find their way to the quartz are limited to those that are above the surfaces of the electrodes and are restricted from depositing onto other unmetallized areas of the quartz element (40). By application of an appropriate electrical potential and in the embodiment shown in FIG. 4, both electrodes (50 and 48) are applied the same potential, molecules can be sputtered from the sputterable material (22) on to the surface of the quartz element (40) to increase the mass loading and thereby decrease the resonant frequency of the device. Those skilled in the art will recognize that by appropriate selection of the potential of the electric potential source (2) ions or molecules may be desputtered or removed from the electrode surfaces and possibly returned back to the source of sputterable material (22) and thereby increasing the resonant frequency of the device shown in FIG. 4.

In the embodiment shown in FIG. 4 the center electrode (52) is actually a coupling electrode that is normally connected to ground by means of the feedthrough (28). For purposes of clarity the portion of the foil depicted in FIG. 3 required to do this is not shown in FIG. 4 for purposes of clarity.

Figure 5:
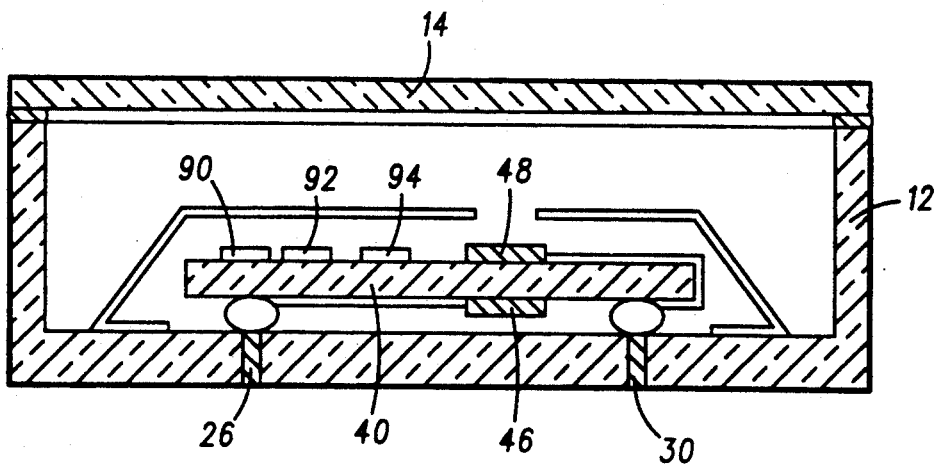
FIG. 5 shows a side view of an alternate embodiment.

FIG. 5 shows an alternate embodiment of an electronic device that uses an aperture mask to tune a quartz crystal oscillator. In FIG. 5 various active and passive components (90, 92, and 94) might be located on an appropriate surface of the piezoelectric element itself or an appropriate substrate for it. Of significant interest in FIG. 5 is the fact that the cover (14) itself is the sputterable material which cover may be selected to be a material such as aluminum, gold or silver for instance. Appropriately bonded to the base (12) and to which direct electrical connection for sputtering may be made.

Connection means for coupling appropriate electrical potentials external to the package (300) are comprised of the conductive vias (26 and 30) in addition to appropriate signal leads that are deposited on to the piezoelectric element (40), as shown.

In the preferred embodiment, the base and cover were ceramic. The seal layer (25) was an appropriate solder having a melting temperature suitable for use in surface mount manufacturing technique. The atmosphere of argon backfilled into the enclosed volume (16) after the volume is evacuated is an argon gas with a pressure between 1 and 100 microns ($\mu$m) of mercury (Hg) selected for the potential and spacing between the electrodes. The piezoelectric device must, of course, have at least one electrode to which sputtered material can be deposited.

The method of tuning the piezoelectric device is comprised largely of the provision of the gaseous atmosphere within the enclosed volume and the inclusion of the sputterable material therein. Using a top (14), in any of the embodiments shown in the figures that is itself a sputterable material, such as that shown in FIG. 5, precludes having to add a separate and discrete amount of such material within the enclosures. Still other embodiments of any of the invention depicted in the figures would contemplate using a base that is itself sputterable electrode material (appropriately structured for attachment to a circuit board however), as well as using an entire enclosure of both the base and cover that are both sputterable electrode material. (If these sputterable tops and/or bottoms are used, appropriate electrical isolation of signal paths within the package would of course be required.) However, by selectively applying appropriate potentials to each of the electrodes, the mass loading of the device can be increased. Those skilled in the art will recognize that it is at least conceptually possible to decrease mass loading of the device by reversing the potential selected to increase mass loading. Such desputtering can be used to remove material from the electrodes on the surfaces of the piezoelectric element.

Using the foregoing described structure, it is possible to do in-situ reconfiguration of electronic devices enclosed within the package. If the enclosed device is a piezoelectric device, its operating frequency characteristics can be adjusted after the piezoelectric device is permanently sealed in a housing that heretofor had precluded adjustment of the characteristics of the device after its enclosure therein. Manufacturing defects attributable to off frequency or frequency shifts can be minimized by appropriately adding material to the piezoelectric surfaces. It additionally might be possible using the foregoing described invention to adjust the resonant frequency of an oscillator after its installation or inclusion in an electronic device such as a radio by energizing the electrodes appropriately. Such a use of the foregoing described invention might permit so-called real time changes to the resonant frequency of an oscillator used in a radio communications device such as a radio or cellular telephone.

What is claimed is:

1. A sealed, electronic device package, including an electronic device enclosed within said package, said package enabling adjustment of said enclosed electronic device comprised of:
   a base;
   a cover, coupled to said base and enclosing thereby a volume;
   a gaseous atmosphere within said enclosed volume at a pressure between 1 and 100 microns of mercury;
   an electronic device enclosed within said volume, having at least one electrode on a surface thereof;
   sputterable electrode material, within said enclosed volume;
   connection means for coupling sources of electrical potentials that are located external to said electronic device package to each of said at least one electrode, and said sputterable electrode material within said enclosed volume.

2. The apparatus of claim 1 further including an aperture mask between said electronic device and said sputterable electrode material.

3. The apparatus of claim 1 where said electronic device is an integrated circuit.

4. The apparatus of claim 1 where said electronic device is an EEPROM.

5. A hermetically sealed piezoelectric package enclosing a piezoelectric device comprised of:
   a base;
   a cover, coupled to said base and enclosing thereby a hermetically sealed volume;
   a gaseous atmosphere within said enclosed volume at a pressure between 1 and 100 microns of mercury;
   a piezoelectric device, having at least one electrode on a surface thereof;
   sputterable electrode material, enclosed within said enclosed volume;
   connection means for coupling sources electrical potentials that are located external to said piezolectric package to each of said at least one electrode, and said sputterable electrode material within said enclosed volume.

6. The apparatus of claim 5 where said piezoelectric device is a crystal filter.

7. The apparatus of claim 5 where said piezoelectric device is a crystal resonator.

8. The apparatus of claim 5 where said piezoelectric device is a surface accoustic wave device.

9. The apparatus of claim 5 where said piezoelectric device is a crystal filter with an in situ finish plate mask.

10. The apparatus of claim 5 where said piezoelectric device is a crystal oscillator.

11. The apparatus of claim 5 where said gaseous atmosphere is comprised of argon gas.

12. The apparatus of claim 5 further including an aperture mask between said piezoelectric device and said sputterable electrode material.

13. The apparatus of claim 5 where said connection means is comprised of a conductive layer between said cover and base.

14. The apparatus of claim 13 where said conductive layer is comprised of solder.

15. A hermetically sealed piezoelectric package enclosing a piezoelectric device comprised of:
   a ceramic base;
   a ceramic cover, coupled to said base and enclosing thereby a hermetically sealed volume;
   an atmosphere of argon gas at a pressure substantially between 1 and 100 mm Hg within said enclosed volume;
   an aperture mask within said enclosed volume;
   a piezoelectric device coupled to said mask, having at least one electrode on a surface thereof;
   sputterable electrode material, enclosed within said enclosed volume; connection means for coupling sources of electrical potentials that are located external to said piezolectric package to each of said at least one electrode, and said sputterable electrode material within said enclosed volume.

16. A hermetically sealed piezoeletric package enclosing a piezoelectric device comprised of:
   a ceramic base;
   a ceramic cover, coupled to said base and enclosing thereby a hermetically sealed volume;
   a seal layer, comprised of conductive material, between said cover and base;
   an atmosphere of argon gas at a pressure substantially between 1 and 100 mm Hg within said enclosed volume;
   a piezoelectric device having at least one electrode on a surface thereof;
   sputterable electrode material, enclosed within said enclosed volume;
   an aperture mask between said piezoelectric device and said sputterable electrode material.

17. A method of tuning a piezoelectric device within an enclosed package having a base and a cover, which together enclose a volume wherein a piezoelectric device having at least one electrode on a surface thereof is located, said method comprised of the steps of:
   providing an atmosphere at a pressure substantially between 1 and 100 mm within said enclosed volume;
   providing a quantity of sputterable electrode material within said enclosed volume;
   selectively applying electrical potentials to each of said quantity of sputterable electrode material and to said at least one electrode on said piezoelectric device to increase mass loading of said at least one electrode on said piezoelectric device.

18. A sealed, electronic device package, including an electronic device therein and enabling adjustment of said enclosed electronic device comprised of:
   a base;
   a cover, comprised of sputterable electrode material, coupled to said base and enclosing thereby a volume;
   a gaseous atmosphere at a pressure substantially between 1 and 100 mm of mercury within said enclosed volume;
   an electronic device enclosed within said volume, having at least one electrode on a surface thereof;
   connection means for coupling sources of electrical potentials that are located external to said electronic device package to each of said at least one electrode, and said sputterable electrode material.

19. The apparatus of claim 18 further including an aperture mask located between said electronic device and said sputterable electrode material.

20. A sealed, electronic device package, including an enclosed electronic device enabling adjustment of said enclosed electronic device comprised of:
a base comprised of sputterable electrode material;
a cover, coupled to said base and enclosing thereby a volume;
a gaseous atmosphere at a pressure substantially between 1 and 100 mm within said enclosed volume;
an electronic device enclosed within said volume, having at least one electrode on a surface thereof;
connection means for coupling sources of electrical potentials that are located external to said electronic device package to each of said at least one electrode, and said sputterable electrode material.

21. The apparatus of claim 20 further including an aperture mask between said electronic device and said sputterable electrode material.

22. A sealed, electronic device package, including an enclosed electronic device enabling adjustment of said enclosed electronic device comprised of:
a base comprised of sputterable electrode material;
a cover comprised of sputterable electrode material, coupled to said base and enclosing thereby a volume;
a gaseous atmosphere at a pressure substantially between 1 and 100 mm within said enclosed volume;
an electronic device enclosed within said volume, having at least one electrode on a surface thereof;
connection means for coupling sources of electrical potentials that are located external to said electronic device package to each of said at least one electrode, and said sputterable electrode material.

23. The apparatus of claim 22 further including an aperture mask between said piezoelectric device and said sputterable electrode material.

24. A sealed, piezoelectric device package, including a piezoelectric device enabling adjustment of said enclosed piezoelectric device comprised of:
a base;
a cover, comprised of sputterable electrode material, coupled to said base and enclosing thereby a volume;
a gaseous atmosphere at a pressure substantially between 1 and 100 mm within said enclosed volume;
a piezoelectric device enclosed within said volume, having at least one electrode on a surface thereof;
connection means for coupling sources of electrical potentials that are located external to said piezoelectric device package to each of said at least one electrode, and said sputterable electrode material.

25. The apparatus of claim 24 further including an aperture mask located between said piezoelectric device and said sputterable electrode material.

26. A sealed, piezoelectric device package, including a piezoelectric device enabling adjustment of said enclosed piezoelectric device comprised of:
a base comprised of sputterable electrode material;
a cover, coupled to said base and enclosing thereby a volume;
a gaseous atmosphere at a pressure substantially between 1 and 100 mm within said enclosed volume;
a piezoelectric device enclosed within said volume, having at least one electrode on a surface thereof;
connection means for coupling sources of electrical potentials that are located external to said piezoelectric device package to each of said at least one electrode, and said sputterable electrode material.

27. The apparatus of claim 26 further including an aperture mask between said piezoelectric device and said sputterable electrode material.

28. A sealed, piezoelectric device package, including a piezoelectric device enabling adjustment of said enclosed piezoelectric device comprised of:
a base comprised of sputterable electrode material;
a cover, coupled to said base and enclosing thereby a volume;
a gaseous atmosphere at a pressure substantially between 1 and 100 mm within said enclosed volume;
a piezoelectric device enclosed within said volume, having at least one electrode on a surface thereof;
connection means for coupling sources of electrical potentials that are located external to said piezoelectric device package to each of said at least one electrode, and said sputterable electrode material.

29. The apparatus of claim 28 further including an aperture mask between said piezoelectric device and said sputterable electrode material.

* * * * *